US 8,771,533 B2

(12) United States Patent
Farooq et al.

(10) Patent No.: US 8,771,533 B2
(45) Date of Patent: Jul. 8, 2014

(54) EDGE PROTECTION SEAL FOR BONDED SUBSTRATES

(71) Applicant: International Business Machines Corporation, Armonk, NY (US)

(72) Inventors: Mukta G. Farooq, Hopewell Junction, NY (US); Emily Kinser, Poughkeepsie, NY (US); Richard S. Wise, Newburgh, NY (US); Hakeem B. S. Akinmade-Yusuff, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/780,854

(22) Filed: Feb. 28, 2013

(65) Prior Publication Data

US 2013/0168017 A1    Jul. 4, 2013

Related U.S. Application Data

(60) Division of application No. 13/556,369, filed on Jul. 24, 2012, which is a continuation of application No. 12/608,363, filed on Oct. 29, 2009, now Pat. No. 8,287,980.

(51) Int. Cl.
*H01L 21/02*    (2006.01)

(52) U.S. Cl.
USPC ............ 216/33; 257/621; 369/126; 428/64.1; 428/66.7

(58) Field of Classification Search
USPC ............ 216/33; 257/621; 369/126; 428/64.1, 428/66.7
See application file for complete search history.

(56) References Cited

U.S. PATENT DOCUMENTS

| 6,238,951 | B1 | 5/2001 | Caillat |
| 6,979,597 | B2 | 12/2005 | Geefay et al. |
| 7,087,538 | B2 | 8/2006 | Staines et al. |
| 7,192,841 | B2 | 3/2007 | Wei et al. |
| 7,303,976 | B2 | 12/2007 | Sand |
| 8,287,980 | B2 | 10/2012 | Farooq et al. |
| 2007/0155129 | A1 | 7/2007 | Thallner |
| 2007/0161149 | A1 | 7/2007 | Lin et al. |
| 2007/0267723 | A1* | 11/2007 | Bernstein et al. ............ 257/621 |
| 2008/0164606 | A1 | 7/2008 | Greisen et al. |
| 2008/0268614 | A1 | 10/2008 | Yang et al. |

OTHER PUBLICATIONS

Method for Sealed Edges of Bonded Wafers for 3D Wafer-Stacking Applications, IP.com No. IPCOM000012779D, May 28, 2003.

* cited by examiner

*Primary Examiner* — Brent O'Hern
(74) *Attorney, Agent, or Firm* — Scully, Scott, Murphy & Presser, P.C.; Catherine Ivers, Esq.

(57) ABSTRACT

A dielectric material layer is deposited on exposed surfaces of a bonded structure that includes a first substrate and a second substrate. The dielectric material layer is formed on an exposed planar surface of a second substrate and the entirety of peripheral sidewalls of the first and second substrates. The dielectric material layer can be formed by chemical vapor deposition, atomic layer deposition, or plasma induced deposition. Further, the dielectric material layer seals the entire periphery of the interface between the first and second substrates. If a planar portion of the dielectric material layer can be removed by planarization to facilitate thinning of the bonded structure, the remaining portion of the dielectric material layer can form a dielectric ring.

20 Claims, 9 Drawing Sheets ically at the periphery of the substrates. The taper or rounding of the surfaces may be caused, for example, by lack of masking on
EDGE PROTECTION SEAL FOR BONDED SUBSTRATES

CROSS REFERENCE TO RELATED APPLICATION

This application is a divisional of U.S. patent application Ser. No. 13/556,369 filed on Jul. 24, 2012, which is a continuation of U.S. patent application Ser. No. 12/608,363, filed on Oct. 29, 2009, the entire content and disclosure of which are incorporated herein by reference.

BACKGROUND

This invention relates to a bonded structure having a peripheral sealing sidewall and methods of manufacturing the same.

Bonding of multiple substrates is required to enable three-dimensional integration of wafers. Because typical substrates have a tapered or rounded surface at the periphery, which is referred to as the bevel region, the contact between two bonded substrates is limited to an area that excludes the periphery of the substrates. The taper or rounding of the surfaces may be caused, for example, by lack of masking on the peripheral area of a substrate during an etch, or by a chuck that presses the substrate down during deposition, or inherent incoming substrate geometry includes a beveled substrate edge, thereby blocking deposition of material on the peripheral area.

Through-substrate-via (TSV) structures, formed after multiple substrates are bonded and optionally thinned, provide electrical connection across the multiple substrates in a bonded structure. A TSV structure includes a conductive material such as copper or tungsten.

Between the step of bonding of two substrates and the step of formation of TSV structures, one or both of the substrates in the bonded structure may be thinned to facilitate formation of TSV structures. The thinning process employs slurries for planarization and generates particles of the material removed from the substrate(s) of the bonded structure. Such materials generated or applied during the thinning process tend to get into the space at the interface between two bonded substrates. Thus, semiconductor devices at the interface of a bonded structure may be subjected to such materials during the thinning process.

Further, the bonded structure may be subjected to wet processing steps, such as wet etching or a wet clean, that are intended to treat exposed backside surfaces and/or surfaces within through substrate cavities within the bonded structure. During such wet processing steps, however, semiconductor structures and materials at the interface between the bonded substrates can be exposed to a wet chemical that seeps in from the periphery of the bonded substrates. Thus, semiconductor devices and materials at the interface of a bonded structure may be subjected an unintentional exposure to wet chemicals employed in processing steps after bonding.

BRIEF SUMMARY

In an embodiment of the present invention, a dielectric material layer is deposited on exposed surfaces of a bonded structure that includes a first substrate and a second substrate. The dielectric material layer is formed on an exposed planar surface of a second substrate and the entirety of peripheral sidewalls of the first and second substrates. The dielectric material layer can be formed by chemical vapor deposition, atomic layer deposition, or plasma induced deposition. Further, the dielectric material layer seals the entire periphery of the interface between the first and second substrates. If a planar portion of the dielectric material layer can be removed by planarization to facilitate thinning of the bonded structure, the remaining portion of the dielectric material layer can form a dielectric ring.

According to an aspect of the present invention, a bonded structure is provided, which includes a first substrate having a first bonding-side surface and a first backside surface; a second substrate having a second bonding-side surface and a second backside surface, wherein the second substrate is bonded to the first substrate through a direct contact between the first bonding-side surface and the second bonding-side surface; and a dielectric material layer laterally contacting a first sidewall surface at a periphery of the first substrate and a second sidewall surface at a periphery of the second substrate and contiguously extending from the first backside surface to the second backside surface.

According to another aspect of the present invention, a method of sealing a bonded structure is provided. The method includes bonding a first substrate and a second substrate, wherein a first bonding-side surface of the first substrate is bonded to a second bonding-side surface of the second substrate at an interface; and forming a dielectric material layer on a first sidewall surface at a periphery of the first substrate and a second sidewall surface at a periphery of the second substrate, wherein the dielectric material layer contiguously extends from a first backside surface of the first substrate to a second backside surface of the second substrate and seals the interface.

DETAILED DESCRIPTION

As stated above, the present invention relates to a bonded structure having a peripheral sealing sidewall and methods of manufacturing the same, which are now described in detail with accompanying figures. The drawings are not necessarily drawn to scale.

As used herein, "sealing" a first element means forming a second element on a surface of said first element to prevent exposure of a surface of said first element to ambient conditions.

As used herein, "sidewall" refers to a region at the edge of the substrate, which is typically beveled.

As used herein, a "sealing sidewall" is a sidewall that provides a sealing on an element.

As used herein, a "periphery" is a one-dimensional closed shape that may be contiguously stretched or deformed to a circle without forming or destroying a contact between any pair of points in the one-dimensional closed shape.

As used herein, a "peripheral sealing sidewall" is a sealing sidewall that is located along a periphery of an element.

As used herein, a "bonding-side surface" of an element is a surface of said element that is bonded to another element.

As used herein, a "backside surface" of an element is a surface of said element that is not bonded to another element.

As used herein, a "polymer" is a molecule synthesized through the process of polymerization of monomers and including repeating structural units connected by chemical bonds.

As used herein, a "polymer material" is a material composed of a polymer.

As used herein, a "non-polymer material" is a material that is not composed of a polymer.

As used herein, a "ring" is an element having a three-dimensional shape that may be contiguously stretched or deformed to a torus without forming or destroying a contact between any pair of points in the three-dimensional shape.

As used herein, an element is "ring-shaped" if the shape of said element is a ring.

Figure 1:
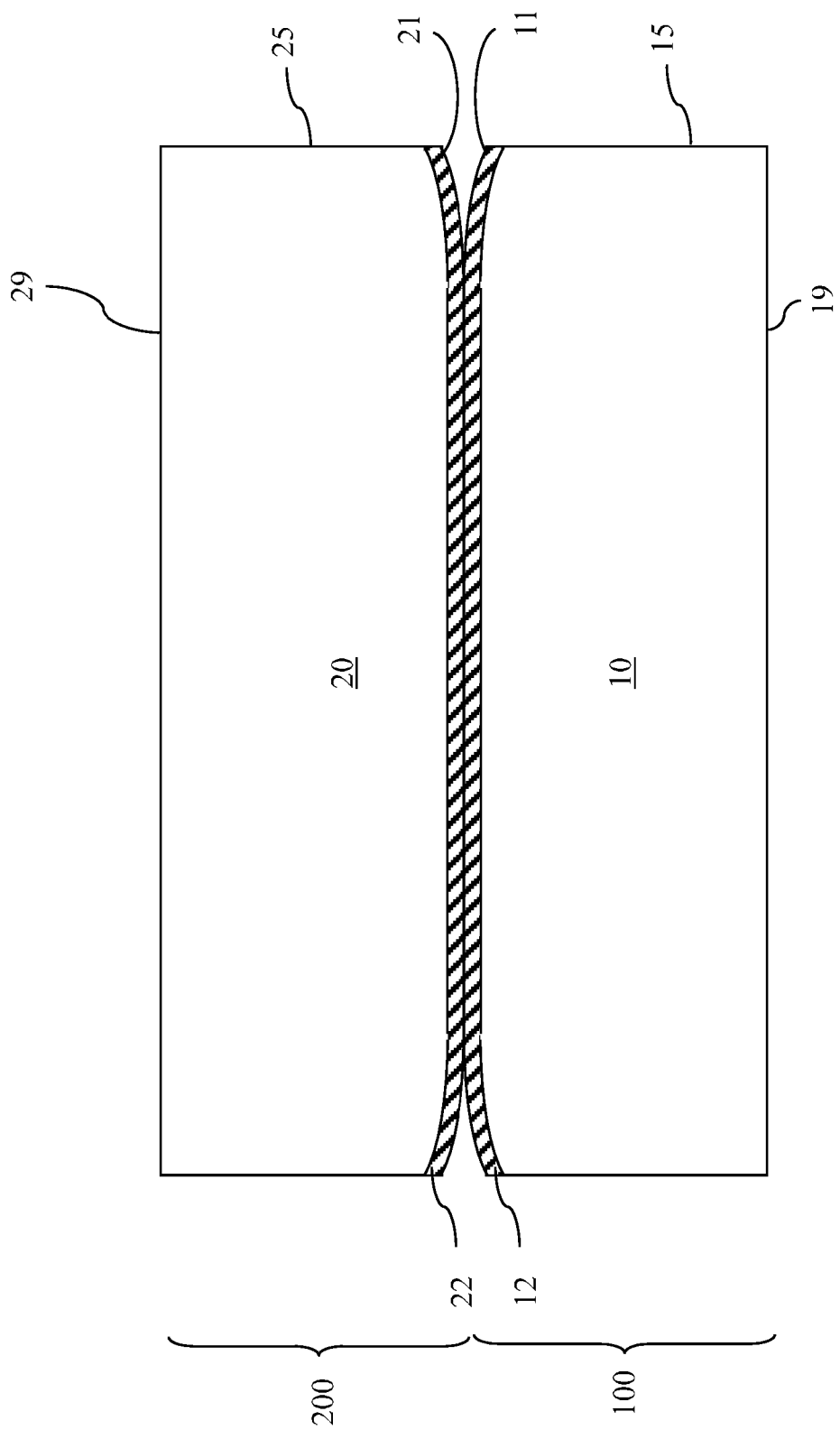
FIG. 1 is a vertical cross-sectional view of a first exemplary structure after bonding of a first substrate and a second substrate according to a first embodiment of the present invention.

Referring to FIG. 1, a first exemplary structure according to a first embodiment of the present invention includes a first substrate 100 and a second substrate 200. The first substrate 100 includes a first substrate layer 10 and a first bonding layer 12. The second substrate 200 includes a second substrate layer 20 and a second bonding layer 22. Outer surfaces of the first substrate 100 include a first bonding-side surface 11 that is the outer surface of the first bonding layer 12, a first backside surface 19 that is an exposed surface of the first substrate layer 10, and a first sidewall surface 15 that substantially normal to the first bonding-side surface 11. Outer surfaces of the second substrate 200 include a second bonding-side surface 21 that is the outer surface of the second bonding layer 22, a second backside surface 29 that is an exposed surface of the second substrate layer 20, and a second sidewall surface 25 that is substantially normal to the first bonding-side surface 11. The second substrate 200 is bonded to the first substrate 100 through a direct contact between the first bonding-side surface 12 and the second bonding-side surface 22.

Each of the first substrate layer 10 and the second substrate layer 20 can include a semiconductor substrate, an insulator substrate, a conductor substrate, or a composite substrate including at least two substrates. In case the first and/or second substrate layer (10, 20) includes a semiconductor substrate, the semiconductor substrate includes a semiconductor material, which may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. A semiconductor substrate, the semiconductor substrate may, or may not, be a single crystalline substrate. At least one semiconductor device (not shown) can be present on or in the semiconductor substrate. The at least one semiconductor device can be, but is not limited to, a field effect transistor, a bipolar transistor, a diode, a resistor, a capacitor, a varactor, an inductor, a carbon nanotube device, or any other type of semiconductor device or a nanoscale device. The semiconductor substrate can include at least one doped region (not shown) therein.

Further, each of the first and second substrates (100, 200) can include at least one dielectric material layer (now shown). The at least one dielectric material layer includes at least one dielectric material, which can be a doped or undoped silicate glass, silicon nitride, a low dielectric constant (low-k) chemical vapor deposition (CVD) material such as organosilicate glass, a low-k spin-on dielectric material such as SiLK™, BLoK™, NBLoK™, or any other type of dielectric material that can be deposited or formed on a substrate and able to hold at least one metal pad therein. Further, at least one metal interconnect structure (not shown) can be embedded in the at least one dielectric material layer to provide electrical connection to the at least one semiconductor device, if present, in the first or second substrates (100, 200).

The first bonding layer 12 and the second bonding layer 22 include a material that can be bonded. For example, the first and second bonding layers (12, 22) can be a pair of copper layers, a pair of silicon oxide or other bonding dielectric layers, or a pair of patterned layer of copper and silicon oxide. In addition, any other bondable material can be employed for the first bonding layer 12 and the second bonding layer, including but not limited to polymeric adhesive materials. The first and second bonding layers (12, 22) can have a thickness from 300 nm to 30,000 nm, although lesser and greater thicknesses can also be employed.

The first bonding-side surface 11 and the second bonding-side surface 21 directly contact each other at a substantially planar plane, which is an interface between the first substrate 100 and the second substrate 200. Due to rounding of the first bonding-side surface 11 and the second bonding-side surface 21, the interface does not extend to the first sidewall surface 15 or the second sidewall surface 25. Instead, the periphery of the interface between the first bonding-side surface 12 and the second bonding-side surface 22 is laterally recessed inward from the first sidewall surface 15 and the second sidewall surface 25. The first backside surface 19 and the second backside surface 29 can be parallel to the interface at which the first bonding-side surface 11 and the second bonding-side surface 21 contact each other.

The thickness of the first substrate 100 and the thickness of the second substrate 200 can be from 50 microns to 1,000 microns, although lesser and greater thicknesses can also be employed. In case the first substrate 100 and the second substrate 200 have a circular horizontal cross-sectional area, the diameter of the first substrate 100 and the second substrate 200 can be from 50 mm to 300 mm, although lesser and greater diameters can also be employed.

Figure 2:
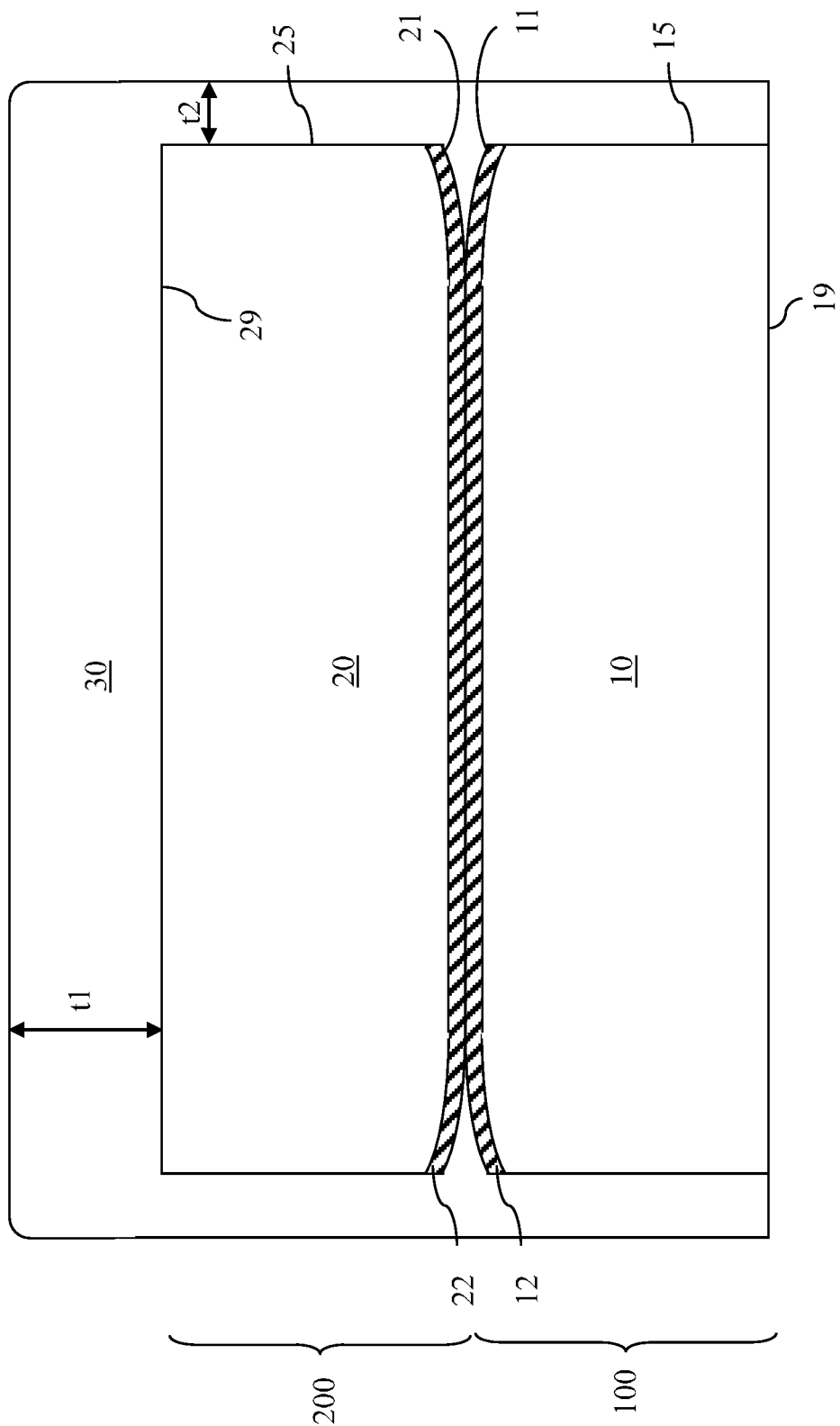
FIG. 2 is a vertical cross-sectional view of the first exemplary structure after forming a dielectric material layer according to the first embodiment of the present invention.

Referring to FIG. 2, a dielectric material layer 30 is formed on the second backside surface 29, the first sidewall surface 15, the second sidewall surface 25, the portion of the first bonding-side surface 12 that does not contact the second bonding-side surface 22, and the portion of the second bonding-side surface 22 that does not contact the first bonding-side surface 12. In one embodiment, the dielectric material layer 30 is formed by placing the bonded structure including the first and second substrates (100, 200) on a chuck and depositing a dielectric material on the exposed surface of the bonded structure. In this case, the dielectric material is not intentionally deposited on the first backside surface 19, although some residual deposition may occur on first backside surface 19. In another embodiment, the dielectric material layer 30 is formed by placing the bonded structure including the first and second substrates (100, 200) on a support structure that contacts only a portion of the first backside surface. In this case, the dielectric material layer 30 can be formed on a portion of the first backside surface 19 as well.

The dielectric material layer 30 laterally contacts the first sidewall surface 15 at a periphery of the first substrate 100 and the second sidewall surface 25 at a periphery of the second substrate 200. The dielectric material layer 30 is a structure of unitary construction, i.e., a structure embodied in a single piece. Thus, the entirety of the dielectric material layer 30 is contiguous. The dielectric material layer 30 contiguously extends from the first backside surface 19 to the second backside surface 19 and covers the second backside surface 29. The dielectric material layer 30 is formed on the entirety of the second backside surface 29, the entirety of the first sidewall surface 15, and the entirety of the second sidewall surface 25.

The dielectric material layer 30 contacts all portions of the first bonding-side surface 12 that does not contact the second bonding-side surface 22 and all portions of the second bonding-side surface 22 that does not contact the first bonding-side surface 12. The dielectric material layer 30 contacts and laterally surrounds a periphery of the interface between the first substrate 100 and the second substrate 200.

The dielectric material layer 30 can be deposited by high density plasma chemical vapor deposition (HDPCVD) or plasma enhanced chemical vapor deposition (PECVD). Alternately, the dielectric material layer 30 can be formed by low pressure chemical vapor deposition (LPCVD), atomic layer deposition (ALD), or sub-atmospheric chemical vapor deposition (SACVD). The dielectric material layer 30 can include an inorganic dielectric material, an organic dielectric material, or a combination thereof.

In case the dielectric material layer 30 includes an inorganic dielectric material, the inorganic dielectric material can be any of silicon oxide, silicon nitride, silicon boride, silicon carbon nitride, a dielectric metal oxide, a dielectric metal nitride, a dielectric metal silicate, and combinations thereof. The silicon oxide can be an undoped silicate glass (USG), or a doped silicate glass such as fluorodilicate glass (FSG), borosilicate glass (BSG), arsenosilicate glass (ASG), phosphosilicate glass (PSG), and borophosphosilicate glass (BPSG). The dielectric metal oxide and the dielectric metal nitride can be an high-k dielectric material such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, and an alloy thereof. Each value of x is independently from 0.5 to 3 and each value of y is independently from 0 to 2. The dielectric metal silicate can be a silicate of any of the dielectric metal oxide and the dielectric metal nitride.

In case the dielectric material layer 30 includes an organic dielectric material, the dielectric material layer 30 can be a polymer material or a non-polymer material. The dielectric material layer 30 can be composed of a material selected from silicon carbide, silicon carbon boride, or an organic polymer.

If the dielectric material layer 30 is deposited by high density plasma chemical vapor deposition (HDPCVD) or plasma enhanced chemical vapor deposition (PECVD), the dielectric material layer 30 is deposited non-conformally. In this case, a first thickness t1 of the dielectric material layer 30 on the second backside surface 29 is greater than a second thickness t2 of the dielectric material layer 30 on the first and second sidewall surfaces (15, 25) because more dielectric material is deposited on the second backside surface 29 than on the first and second sidewall surfaces (15, 25) of the first and second substrates (100, 200).

The second thickness t2 of the dielectric material layer can be from 100 nm to 3,000 nm, although lesser and greater thicknesses are also contemplated herein. If the second thickness t2 exceeds one half of the maximum separation distance between the first bonding-side surface 11 and the second bonding-side surface 12, all space between the first bonding-side surface 11 and the second bonding-side surface is filled with the dielectric material layer 30. The maximum separation distance between the first bonding-side surface 11 and the second bonding-side surface 12 is typically from 1 micron to 3 microns, although lesser and greater maximum separation distances can also be employed depending on the planarity of the first and second bonding-side surfaces (11, 21).

Figure 3:
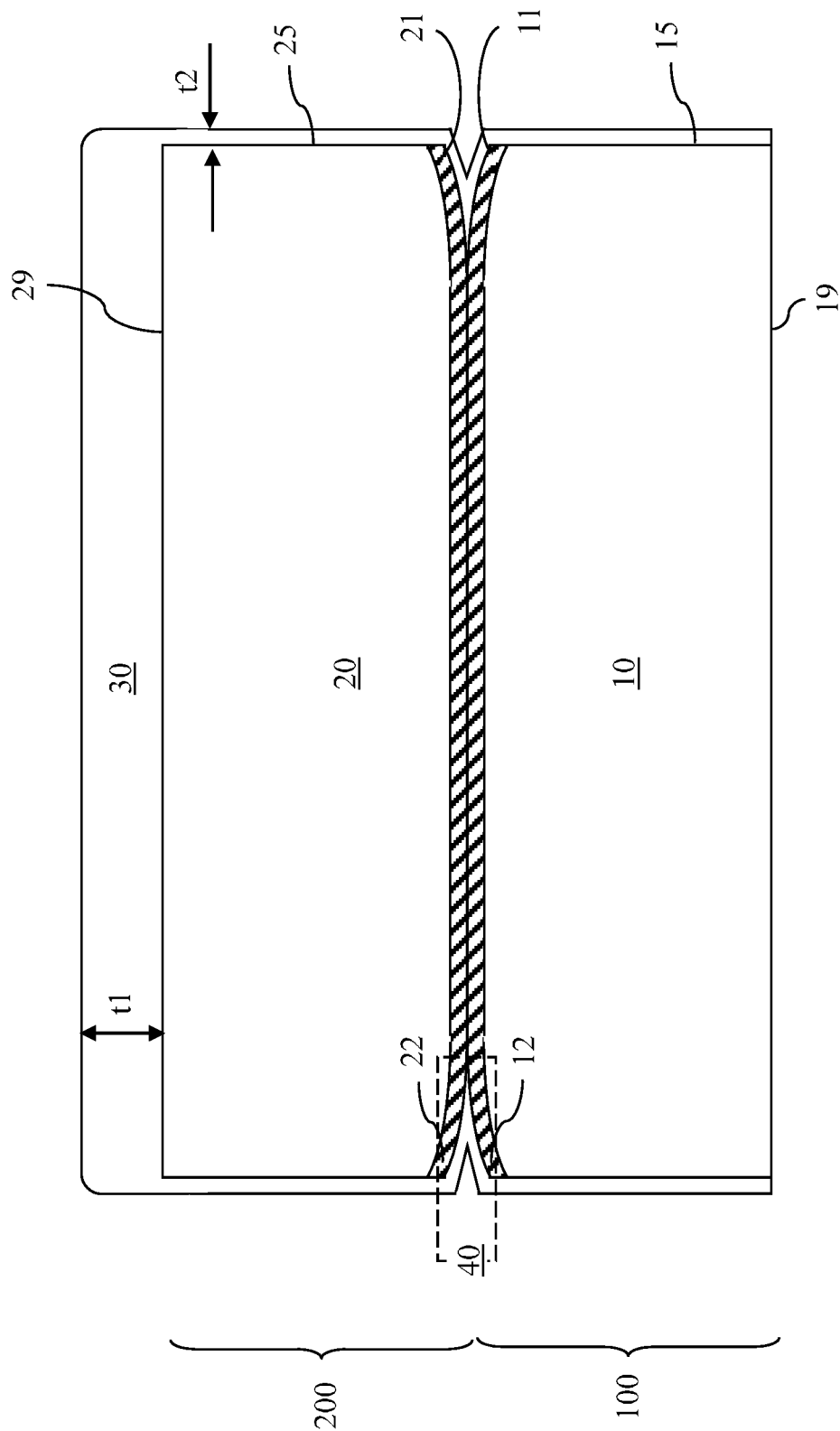
FIG. 3 is a vertical cross-sectional view of a second exemplary structure after forming a dielectric material layer according to a second embodiment of the present invention.

Referring to FIG. 3, a second exemplary structure according to a second embodiment of the present invention includes a dielectric material layer 30 that can be formed employing the same methods as in the first embodiment. In the second embodiment, the second thickness t2 of the dielectric material layer 30 is less than the maximum separation between the first bonding-side surface 11 and the second bonding-side surface 12. Thus, the dielectric material layer 30 does not completely fill a peripheral gap between the first substrate 100 and the second substrate 200.

The dielectric material layer 30 includes a laterally recessed portion 40 at a periphery of the interface between the first bonding-side surface 11 and the second bonding-side surface 21. The outer surface of the dielectric material layer 30 is recessed inward toward the interface at the laterally recessed portion 40. The peripheral gap is present in the laterally recessed portion 40 between a portion of the dielectric material layer 30 on the first bonding-side surface 11 and a portion of the dielectric material layer 30 on the second bonding-side surface 21. The laterally recessed portion 40 laterally encircles the interface.

Figure 4:
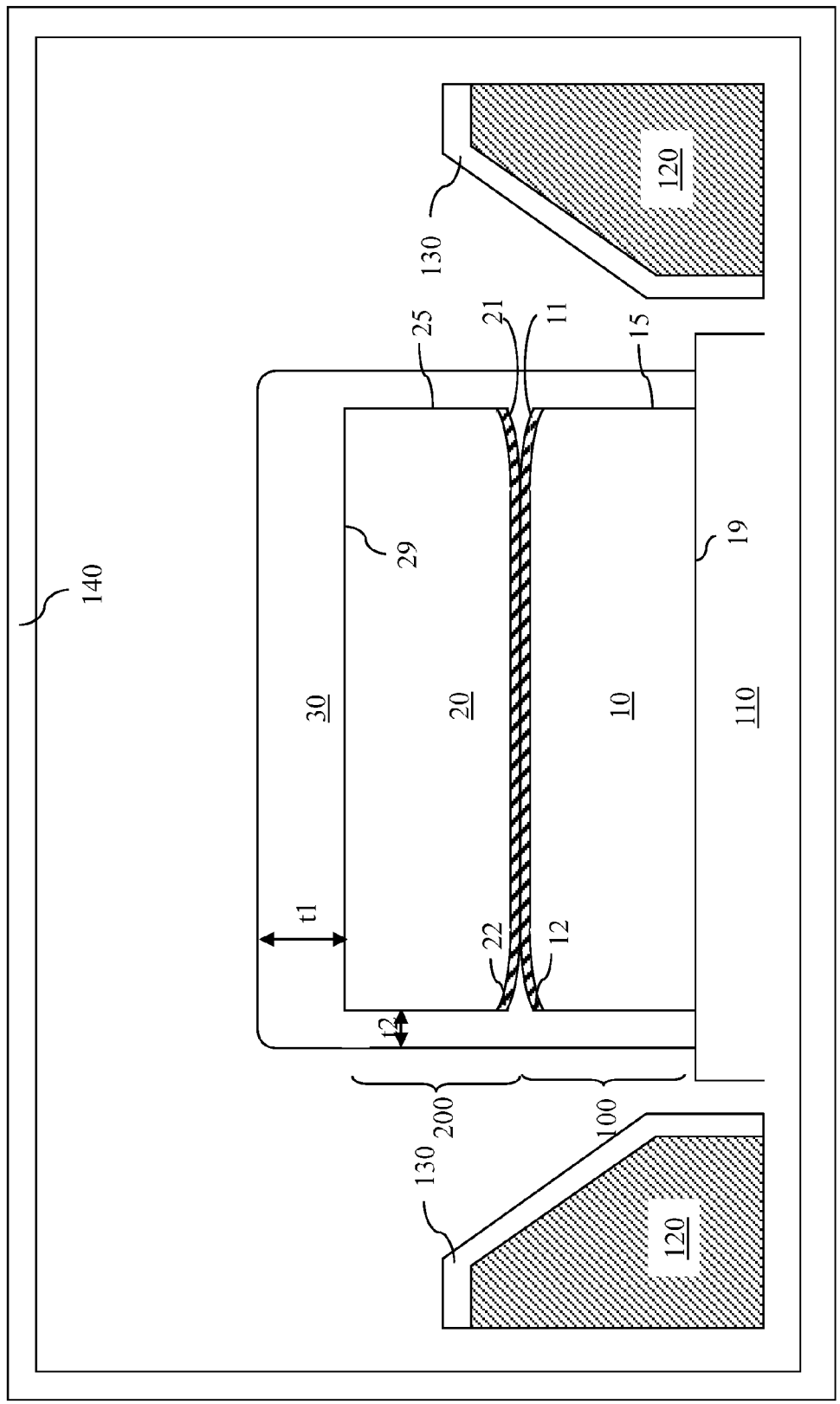
FIG. 4 is a vertical cross-sectional view of a third exemplary structure during deposition of dielectric material layer according to a third embodiment of the present invention.

Referring to FIG. 4, a third exemplary structure according to a third embodiment of the present invention includes a bonded structure of a first substrate 100 and a second substrate 200 that is placed in a plasma deposition chamber. The plasma deposition chamber includes an enclosure 140, a chuck 110, and a focus ring 120. The bonded structure of the first substrate 100 and the second substrate 200 is placed on the chuck 110 such that the first backside surface 19 contacts a top surface of the chuck 110. The inside of the enclosure is maintained in a vacuum environment at a pressure less than 10 mTorr, and typically less than 0.1 mTorr.

A reactant gas including a precursor material for the dielectric material layer 30 is introduced into the process chamber through at least one opening (not shown) in the enclosure. The pressure in the enclosure 140 is maintained in a range from 0.1 mTorr to 10 mTorr, and a radio frequency (RF) power is applied to generate a plasma in the enclosure 140. The reactant gas is decomposed to generate a monomer, which is subsequently polymerized upon deposition on the bonded structure of the first substrate 100 and the second substrate 200. For example, the reactant gas can be $C_4F_8$, which generates a monomer of $-CF_2-$. The monomer is polymerized on the surfaces of the bonded structure of the first substrate 100 and the second substrate 200 and constitutes a dielectric material layer 30.

A polymer layer 130 is formed on the surfaces of the focus ring 120. The polymer layer 130 has the same polymeric material as the dielectric material layer 30, i.e., the polymer material that is formed by polymerization of the monomers. The plasma impinges on the polymer layer 130 and sputters the material of the polymer layer 130 on the first and second sidewall surfaces (15, 25) of the first and second substrates (100, 200). The sputtered polymeric material from the polymer layer 130 can be deposited between the first bonding-side surface 11 and the second bonding-side surface 21 to facilitate filling the gap between the first bonding-side surface 11 and the second bonding-side surface 21.

Other hydro-fluorocarbon feedstock reactant gases that can be employed include, but are not limited to, $C_xF_y$, $C_xH_yF_z$, $SF_6$, $C_2H_4$, $N_2/H_2$, and $CH_4$, combined with carrier gases such as He, Ar, and $N_2$. Monomers that can be derived from the reactant gas include, but are not limited to, $CF_x$, $C_xH_y$, $C_xN_yH_z$, and $C_xH_yF_z$. The polymer material of the dielectric material layer 30 is formed by polymerization of at least one monomer.

Figure 5:
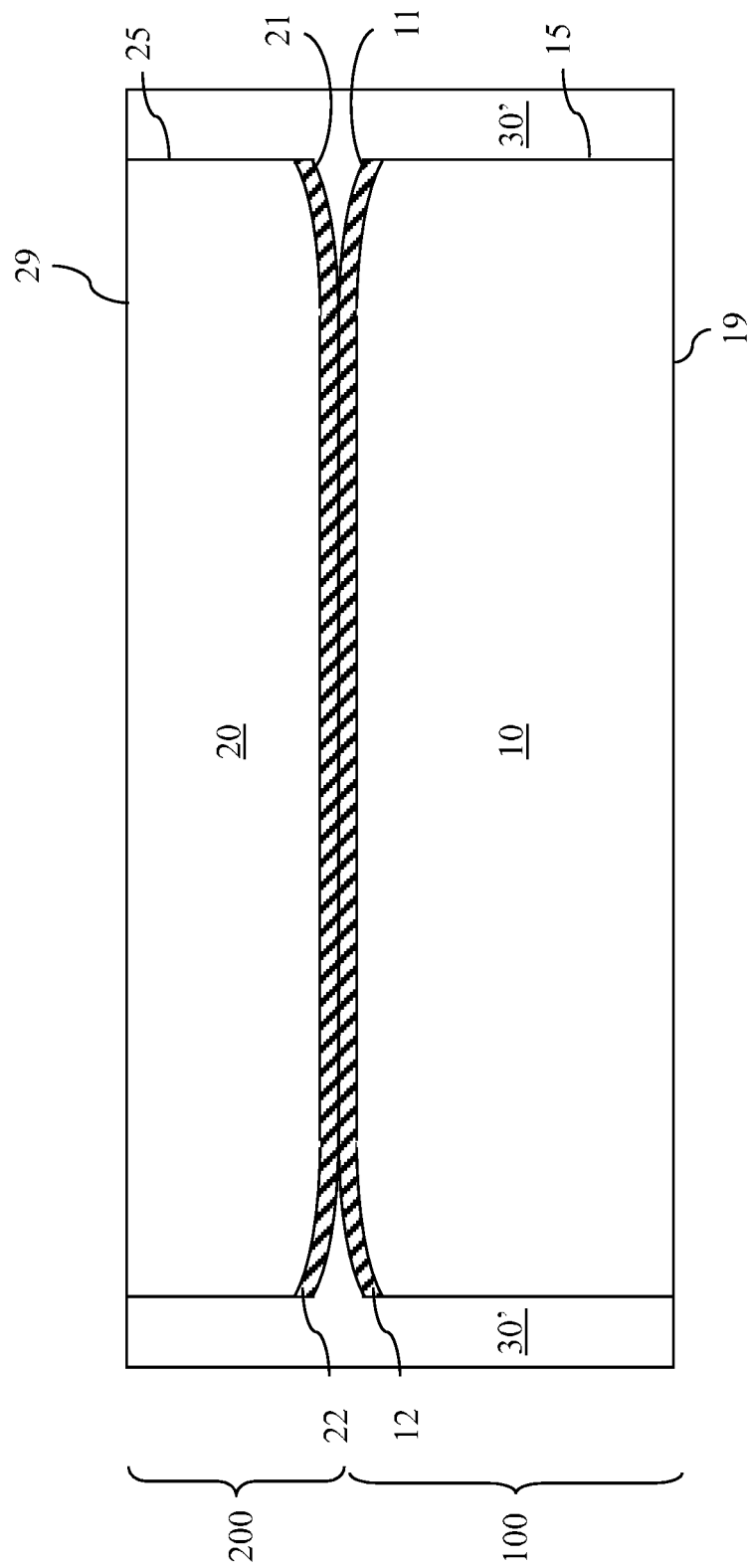
FIG. 5 is a vertical cross-sectional view of a fourth exemplary structure after thinning of the second substrate by planarization according to a fourth embodiment of the present invention.

Referring to FIG. 5, a fourth exemplary structure according to a fourth embodiment of the present invention is derived from the first, second, or third exemplary structure of the present invention by thinning of the second substrate 200 by planarization. The second substrate 200 can be thinned, for example, by grinding, chemical mechanical planarization, a chemical etch, or a combination thereof.

The portion of the dielectric material layer 30 above the second backside surface 29 of the second substrate 200 is removed. The second backside surface 29 is vertically recessed and moves toward the second bonding-side surface 21 as the second substrate 200 is thinned. The dielectric material layer 30', which is formed by the remaining portion of the dielectric material layer 30 (See FIGS. 2-4) prior to planarization, is a ring-shaped structure. The first and second backside surfaces (19, 29) do not contact a surface of the dielectric material layer 30'. An end surface of the ring-shaped structure of the dielectric material layer 30' can be coplanar with the first backside surface 19, and another end surface of the ring-shaped structure of the dielectric material layer 30' can be coplanar with the second backside surface 29.

Optionally, the first substrate 100 can be thinned as well by removing the material of the first substrate 100 from the side of the first backside surface 19. The material of the first substrate 100 can be removed, for example, by grinding, chemical mechanical planarization, a chemical etch, or a combination thereof.

Through-substrate vias (not shown) can be formed through the first and second substrates (100, 200) by forming deep trenches and depositing a dielectric liner material and a conductive material to fill the deep trenches. Excess material outside the deep trenches can be removed, for example, by a recess etch or a planarization.

The ring-shaped structure of the dielectric material layer 30' is a peripheral sealing sidewall for the first and second substrates (100, 200) that provides a sealing of the interface between the first bonding-side surface 11 and the second bonding-side surface 21. Wet clean processing steps can be employed during the formation of the through-substrate vias without concern about potential damage to the bonding between the first and second substrates (100, 200) because the interface between the first bonding-side surface 11 and the second bonding-side surface 21 is sealed by the ring-shaped structure of the dielectric material layer 30'.

Figure 6:
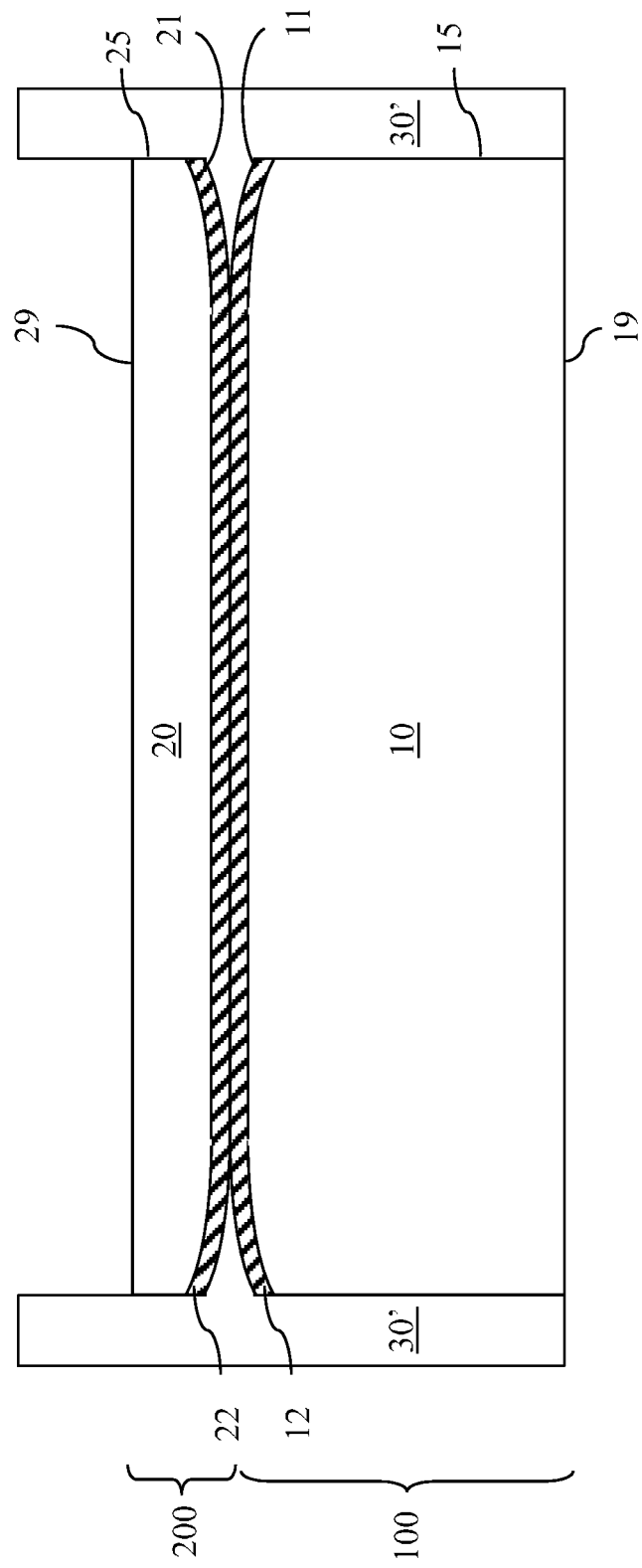
FIG. 6 is a vertical cross-sectional of the fourth exemplary structure after further thinning of the second substrate by a chemical etching step according to the fourth embodiment of the present invention.

Referring to FIG. 6, the fourth exemplary structure can be subjected to additional thinning, which can be effected, for example, by a chemical etching step. The second backside surface 29 can be vertically recessed by chemical mechanical planarization or an etch process relative to the ring-shaped structure of the dielectric material layer 30'. The etch of the second substrate 200 from the second backside surface 29 can be timed. Alternately, the second substrate 20 can include a plurality of layers having different compositions, and the etch of the second substrate 200 from the second backside surface 29 can be a selective etch that stops on a surface of a layer having a composition that is resistant to the etchant employed in the etching process.

Figure 7:
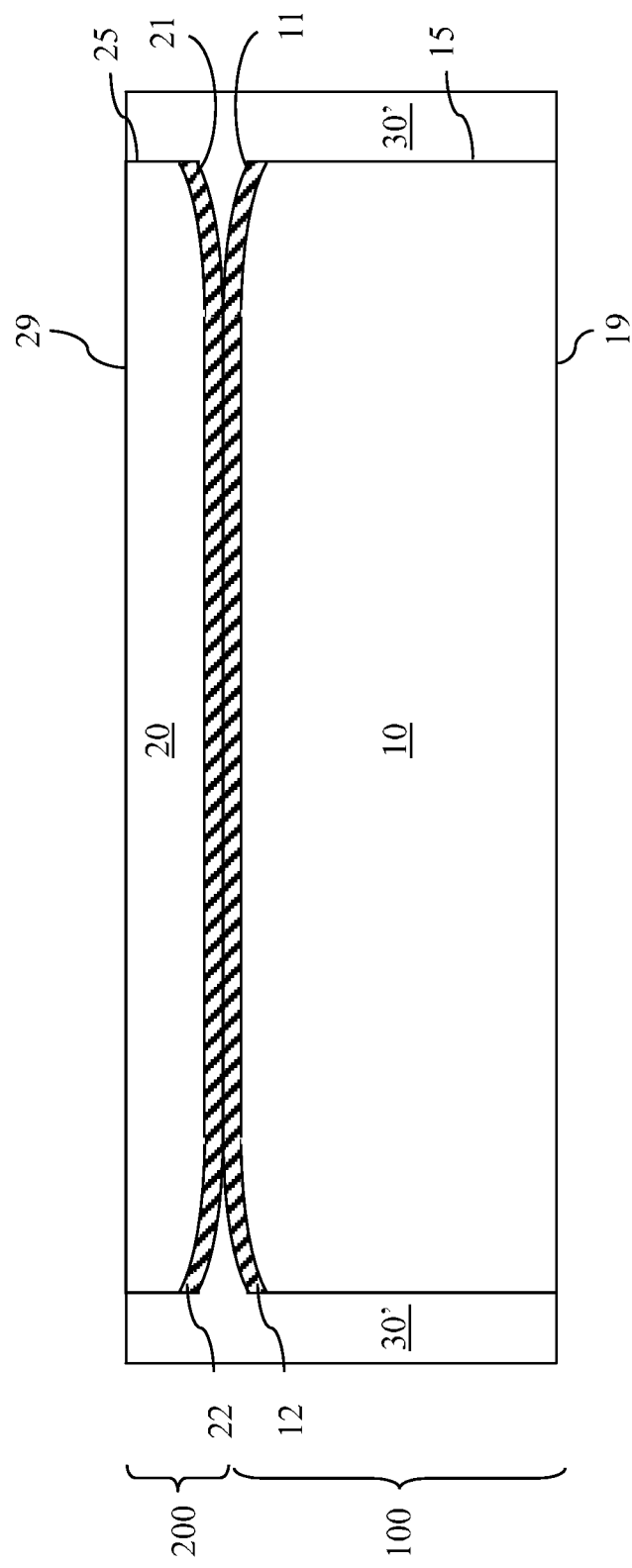
FIG. 7 is a vertical cross-sectional view of the fourth exemplary structure after a touch-up planarization according to the fourth embodiment of the present invention.

Referring to FIG. 7, the fourth exemplary structure can be subjected to a touch-up chemical mechanical planarization to remove a portion of the ring-shaped structure of the dielectric material layer 30' that protrudes above the second backside surface 29 or the first backside surface 19, if any of dielectric material layer 30' remains. Additional cleaning processes employing a wet chemical can be performed without affecting the bonding between the first and second substrates (100, 200).

Figure 8:
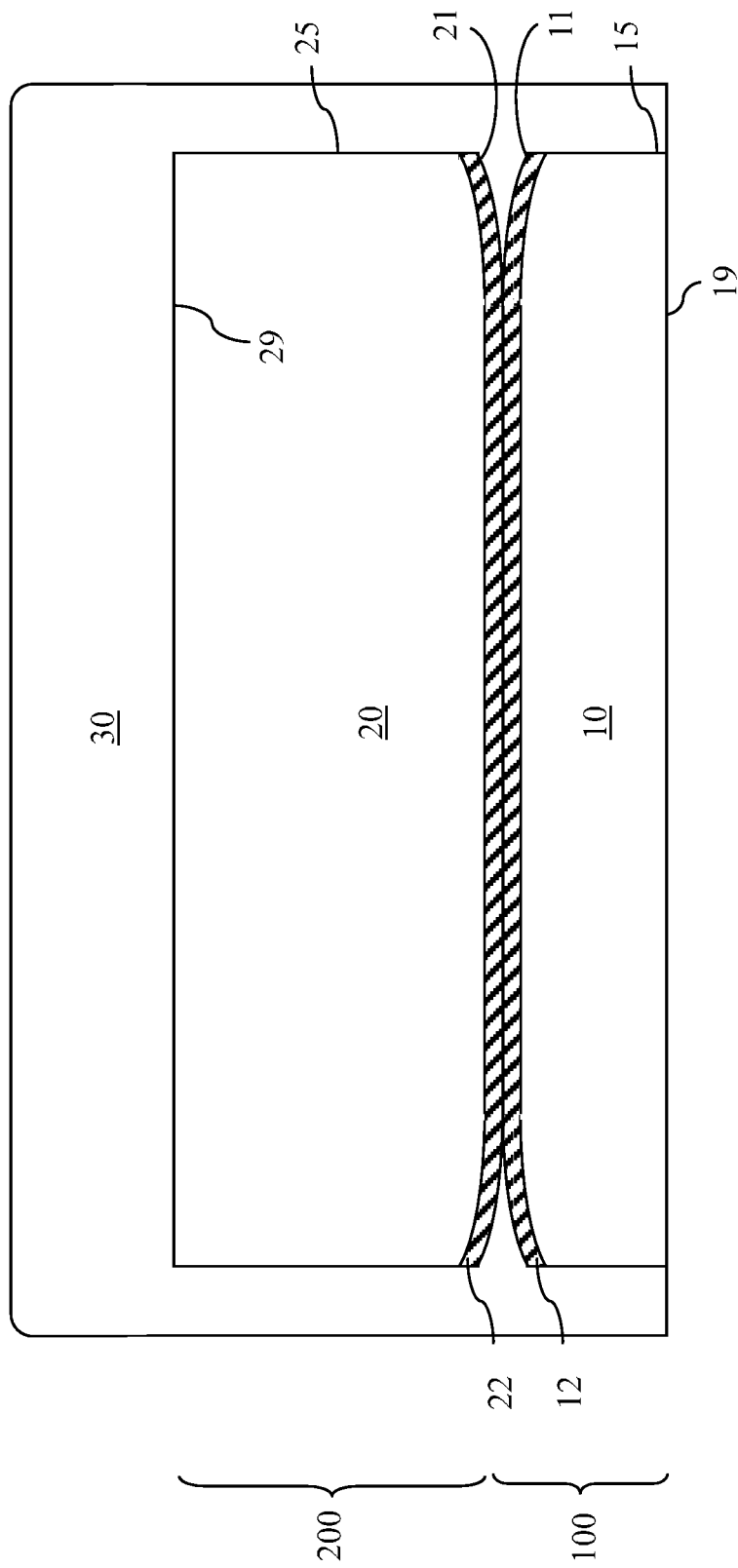
FIG. 8 is a vertical cross-sectional view of a fifth exemplary structure according to a fifth embodiment of the present invention.

Referring to FIG. 8, a fifth exemplary structure according to a fifth embodiment of the present invention can be derived from any of the first, second, and third exemplary structures by thinning the first substrate 100. The first substrate 100 can be thinned, for example, by grinding, chemical mechanical planarization, a chemical etch, or a combination thereof. Through substrate vias can be formed from the side of the first backside surface 19. If a wet etching process is employed, the dielectric material layer 30 protects the interface between the first and second substrates (100, 200) by sealing the first sidewall surface 15 and the second sidewall surface 25.

The processing steps of FIGS. 5-8 can be employed individually or in combination to effect formation of additional structural features in the bonded structure of the first substrate 100 and the second substrate 200. The ring-shaped structure of the dielectric material layer 30' as in FIGS. 5-7 or the dielectric material layer 30 as in FIG. 8 seals the portion of the first bonding-side surface 11 that does not contact the second bonding-side surface 21 and the portion of the second bonding-side surface 21 that does not contact the first bonding-side surface 11. Thus, access of wet chemicals or dry etchants to the unbonded portions of the first and second bonding-side surfaces (11, 21) is prevented by the ring-shaped structure of the dielectric material layer 30' or the dielectric material layer 30 during formation of additional structural features after the bonding of the first and second substrates (100, 200).

Figure 9:
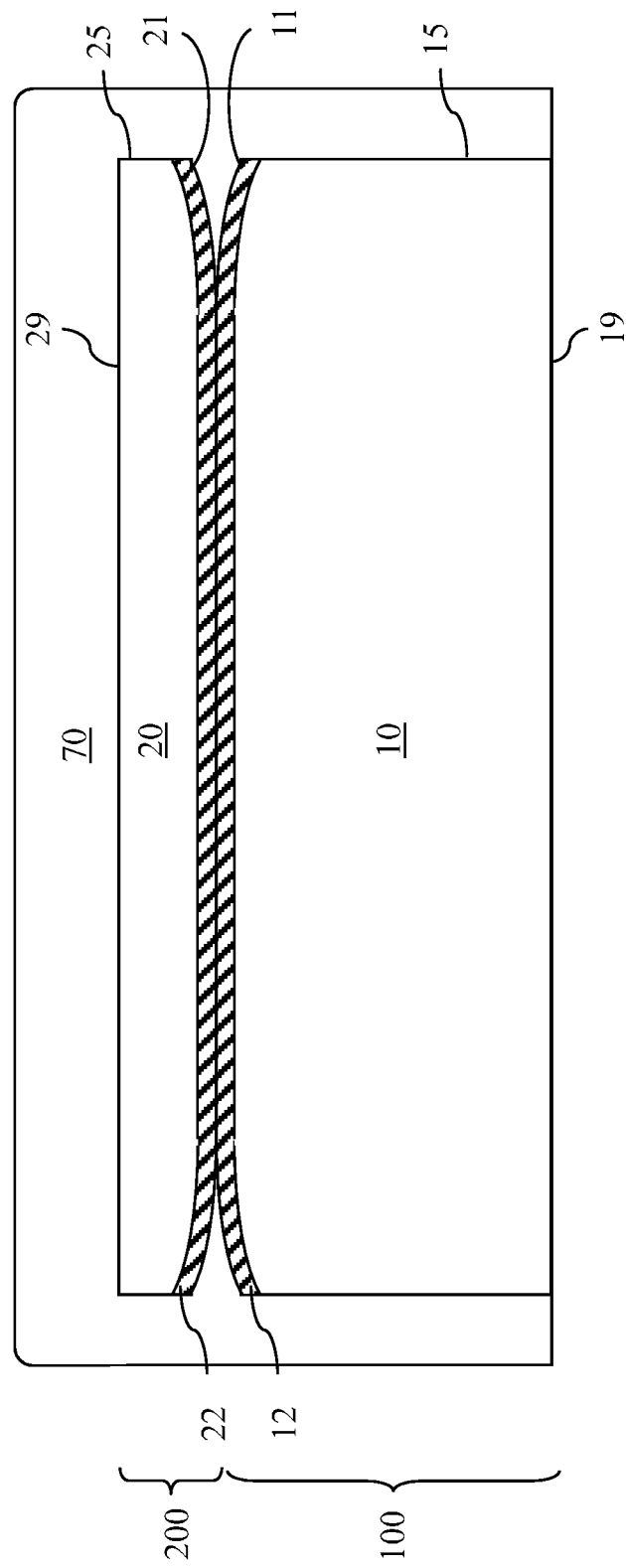
FIG. 9 is a vertical cross-sectional view of a sixth exemplary structure according to a sixth embodiment of the present invention.

Referring to FIG. 9, a sixth exemplary structure according to a sixth embodiment of the present invention can be derived from any of the first through fifth exemplary structures by removing the ring-shaped structure of the dielectric material layer 30' or the dielectric material layer 30 that covers the second backside surface 29. The ring-shaped structure of the dielectric material layer 30' or the dielectric material layer 30 can be removed as needed, or can be used up during a long etch process. In this case, another dielectric material layer 70 can be formed on the exposed portions of the first and second bonding-side surfaces (11, 21), the first and second sidewall surfaces (15, 25), and one of the first and second backside surfaces (19, 29) as need employing the same methods as described above for formation of a dielectric material layer 30. The material of the other dielectric material layer 70 is any material that can be employed for the dielectric material layer 30' or the dielectric material layer 30. Thus, the present invention allows repeated formation and removal of dielectric material layers which can be employed to seal portions of the first and second bonding-side surfaces (11, 21) that do not contact each other to form an interface. Each dielectric material laterally surrounds and seals the interface between the first and second substrates (100, 200).

While the present invention has been particularly shown and described with respect to preferred embodiments thereof, it will be understood by those skilled in the art that the foregoing and other changes in forms and details can be made without departing from the spirit and scope of the present invention. It is therefore intended that the present invention not be limited to the exact forms and details described and illustrated, but fall within the scope of the appended claims.

What is claimed is:

1. A method of sealing a bonded structure comprising:
bonding a first substrate and a second substrate, wherein a first bonding-side surface of said first substrate is bonded to a second bonding-side surface of said second substrate at an interface;
forming a dielectric material layer on a first sidewall surface at a periphery of said first substrate and a second sidewall surface at a periphery of said second substrate, wherein said dielectric material layer contiguously extends from a periphery of a first backside surface of said first substrate to a second backside surface of said second substrate and seals said interface; and
thinning said second substrate by planarization.

2. The method of claim 1, wherein said dielectric material layer is formed directly on all portions of said first bonding-side surface that does not contact said second bonding-side surface and all portions of said second bonding-side surface that does not contact said first bonding-side surface.

3. The method of claim 1, wherein said dielectric material layer is formed directly on a periphery of said interface, and said dielectric material layer laterally surrounds said interface.

4. The method of claim 1, wherein said dielectric material layer is formed on an entirety of said second backside surface and an entirety of said first sidewall surface and said second sidewall surface.

5. The method of claim 1, further comprising:
removing a portion of said dielectric material layer from above said second backside surface; and
vertically recessing said second backside surface by chemical mechanical planarization or an etch process.

6. The method of claim 1, wherein an entirety of said dielectric material layer is contiguous, and said dielectric material layer contacts an entirety of said second backside surface.

7. The method of claim 1, wherein said dielectric material layer is deposited non-conformally.

8. The method of claim 7, wherein a first thickness of said dielectric material layer on said second backside surface is greater than a second thickness of said dielectric material layer on said first and second sidewall surfaces.

9. The method of claim 1, wherein a remaining portion of said dielectric material layer includes a surface that is coplanar with said second backside surface.

10. The method of claim 1, wherein a remaining portion of said dielectric material layer does not overlie or underlie any area of said direct contact between said first bonding-side surface and said second bonding-side surface.

11. The method of claim 1, wherein a remaining portion of said dielectric material layer forms a ring-shaped structure.

12. The method of claim 1, wherein said dielectric material layer has a same composition at every surface portion that contacts said first substrate and said second substrate.

13. The method of claim 1, wherein said dielectric material layer is deposited directly on peripheral regions of said first bonding-side surface that is not within a plane of said interface and peripheral regions of said second bonding-side surface that is not within said plane of said interface.

14. A method of sealing a bonded structure comprising:
bonding a first substrate and a second substrate, wherein a first bonding-side surface of said first substrate is bonded to a second bonding-side surface of said second substrate at an interface; and
forming a dielectric material layer on a first sidewall surface at a periphery of said first substrate and a second sidewall surface at a periphery of said second substrate, wherein said dielectric material layer contiguously extends from a periphery of a first backside surface of said first substrate to a second backside surface of said second substrate and seals said interface, wherein said dielectric material layer is deposited by high density plasma chemical vapor deposition (HDPCVD) or plasma enhanced chemical vapor deposition (PECVD).

15. The method of claim 14, wherein an inorganic dielectric material is deposited to form said dielectric material layer.

16. The method of claim 15, wherein said dielectric material layer is composed of a material selected from silicon oxide, silicon nitride, silicon boride, silicon carbon nitride, a dielectric metal oxide, a dielectric metal nitride, a dielectric metal silicate, and combinations thereof.

17. The method of claim 14, wherein an organic material is deposited to form said dielectric material layer.

18. The method of claim 17, wherein said dielectric material layer is composed of a material selected from silicon carbide, silicon carbon boride, an organic polymer.

19. The method of claim 14, further comprising:
removing a portion of said dielectric material layer from above said second backside surface; and
vertically recessing said second backside surface by chemical mechanical planarization or an etch process.

20. A method of sealing a bonded structure comprising:
bonding a first substrate and a second substrate, wherein a first bonding-side surface of said first substrate is bonded to a second bonding-side surface of said second substrate at an interface; and
forming a dielectric material layer on a first sidewall surface at a periphery of said first substrate and a second sidewall surface at a periphery of said second substrate, wherein said dielectric material layer contiguously extends from a periphery of a first backside surface of said first substrate to a second backside surface of said second substrate and seals said interface, wherein said dielectric material is composed of an organic polymer in which a monomer of —$CF_2$— is polymerized.

* * * * *